United States Patent
Kuwata et al.

(10) Patent No.: US 7,483,464 B2
(45) Date of Patent: Jan. 27, 2009

(54) SEMICONDUCTOR LASER APPARATUS AND MANUFACTURING METHOD THEREOF

(75) Inventors: Yasuaki Kuwata, Ebina (JP); Hideo Nakayama, Ebina (JP); Akemi Murakami, Ebina (JP); Ryoji Ishii, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 322 days.

(21) Appl. No.: 10/978,487

(22) Filed: Nov. 2, 2004

(65) Prior Publication Data

US 2005/0238076 A1 Oct. 27, 2005

(30) Foreign Application Priority Data

Apr. 22, 2004 (JP) ............................. 2004-126269

(51) Int. Cl.
*H01S 5/00* (2006.01)
(52) U.S. Cl. ............... 372/50.1; 372/50.122; 372/50.12
(58) Field of Classification Search ................ 372/50.1, 372/50.12, 50.122
See application file for complete search history.

(56) References Cited

U.S. PATENT DOCUMENTS

| | | | | |
|---|---|---|---|---|
| 5,115,441 A | * | 5/1992 | Kopf et al. | 372/45.01 |
| 5,337,327 A | * | 8/1994 | Ackley | 372/45.01 |
| 6,185,240 B1 | * | 2/2001 | Jiang et al. | 372/50.124 |
| 6,468,821 B2 | * | 10/2002 | Maeda et al. | 438/29 |
| 6,882,669 B2 | * | 4/2005 | Hang et al. | 372/43.01 |
| 6,936,855 B1 | * | 8/2005 | Harrah | 257/88 |

FOREIGN PATENT DOCUMENTS

| | | |
|---|---|---|
| JP | 11-112026 | 4/1999 |
| JP | 11112026 A * | 4/1999 |

OTHER PUBLICATIONS

Bobby M. Hawkins, et al. "Reliability of Various Size Oxide Aperture VCSELs." *Honeywell International.*, 2002.

* cited by examiner

*Primary Examiner*—Minsun Harvey
*Assistant Examiner*—Patrick Stafford
(74) *Attorney, Agent, or Firm*—Morgan, Lewis & Bockius LLP

(57) ABSTRACT

A semiconductor laser apparatus includes a substrate, a vertical-cavity surface-emitting semiconductor laser diode (VCSEL) including a first and second mirror layers of a first and second conduction types, respectively, an active region between the first and second mirror layers, a first and second electrode layers electrically connected with the first and second mirror layers, respectively, and at least one Zener diode including a first and second semiconductor regions of a first and second conduction types, respectively, and a third and fourth electrode layers electrically connected with the first and second semiconductor regions, respectively. The second semiconductor region is formed in a portion of the first semiconductor region and forms a PN junction with the first semiconductor region. The VCSEL and the Zener diode are formed on the substrate. The first and second electrode layers are electrically connected with the fourth and third electrode layers, respectively.

15 Claims, 8 Drawing Sheets

F I G. 4
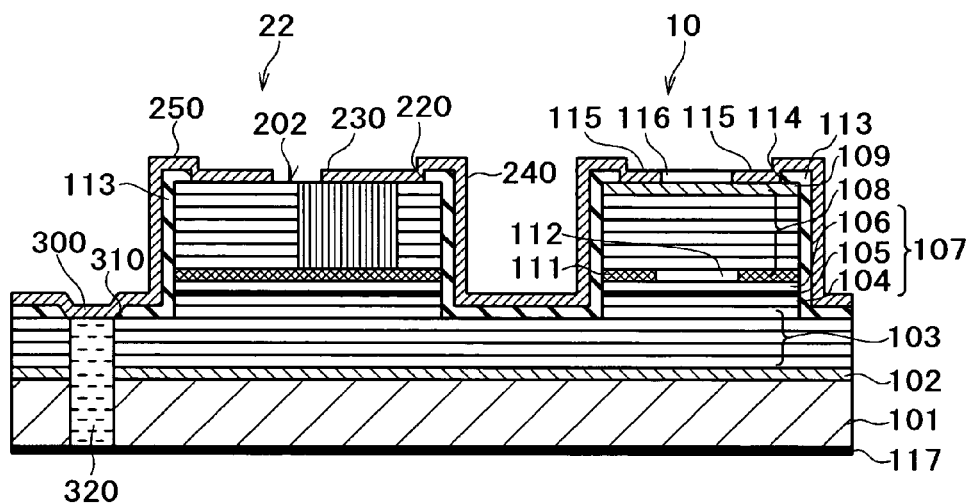
F I G. 5
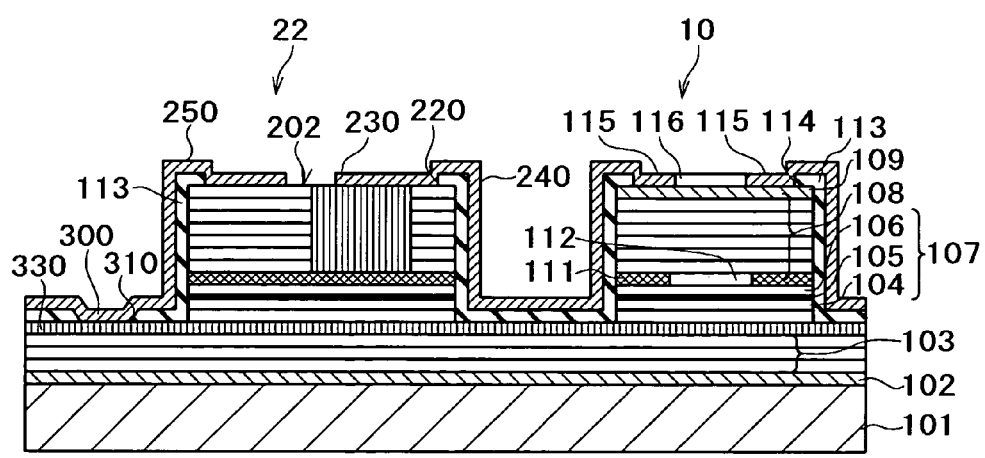

F I G. 9 A
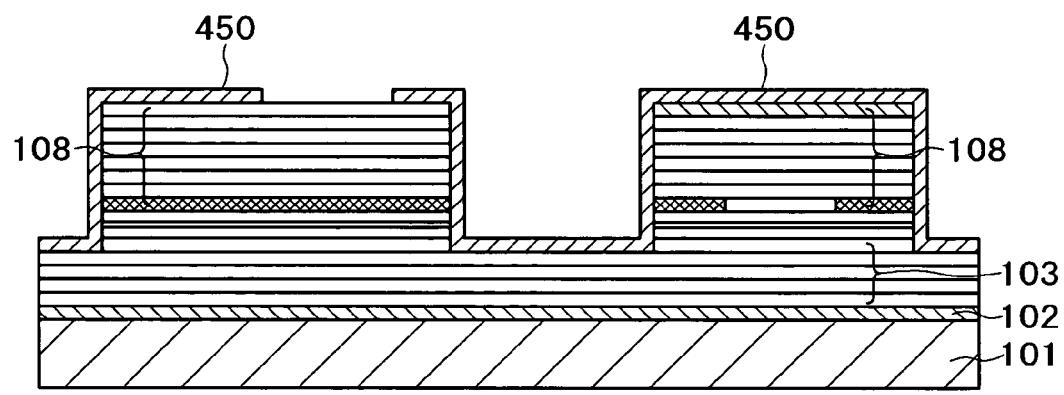
F I G. 9 B
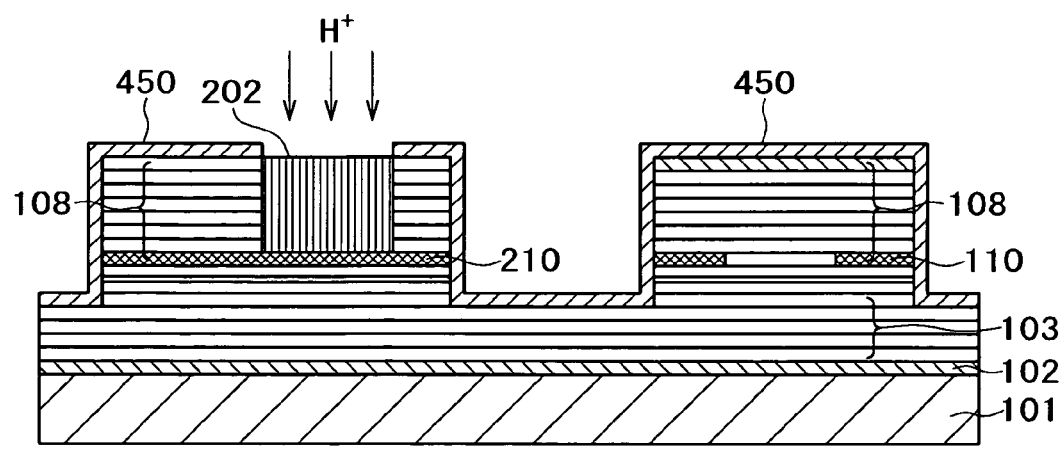

SEMICONDUCTOR LASER APPARATUS AND MANUFACTURING METHOD THEREOF

BACKGROUND OF THE INVENTION

1. Field of the Invention

The present invention concerns a vertical-cavity surface-emitting laser diode (hereinafter referred to as VCSEL) and, it specifically relates to a protective structure for protecting the VCSEL against electrostatic damage.

2. Description of the Related Art

The VCSEL has excellent features in that it has low threshold current, small power consumption and can obtain a circular light spot easily, and light sources can be arranged as a two-dimensional array, and it has been expected for use as a light source in optical communication equipment or electronic equipment.

Like other semiconductor devices, the VCSEL is sometimes exposed to a high voltage by static electricity in handling of circuit substrates, etc. If electrostatic discharge (hereinafter referred to as ESD) should occur inside the device, since a large spike current flows instantaneously, this destroys or deteriorates the device causing a failure not capable of conducting normal operation. Several reports have been made for coping with such problems.

In Japanese Published Unexamined Patent Application No. Hei 11-112026, a protective device is provided separately from a light emitting device considering that the withstand voltage is as low as 50 V in the reverse direction and 150 V in the forward-direction in semiconductor light emitting devices, particularly, gallium nitride compound semiconductors. As the protective device, a Zener diode or a transistor is used, for example, thereby short-circuiting the reverse voltage or a forward voltage higher than the working voltage possibly applied to the light emitting device.

In U.S. Pat. No. 6,185,240B1, a diode as a countermeasure for ESD and VCSEL are integrated to form both of them on one identical chip. A trench is formed on the substrate to define a diode region. The diode is, preferably, a p-i-n diode having a breakdown voltage of from 10 to 20 V.

Further, Bobby M. Hawkings et al., "Reliability of Various Size Oxide Aperture VCSELs" Honeywell, 2000 is a study report on the reliability of a selective oxidation type VCSEL and describes a relation between the breakdown voltage due to ESD and oxidized aperture. In this report, ESD damage is tested by a human body model according to US MIL standards, and an oxidized aperture size of from 5 to 20 µm is used as a sample. When a pulse voltage in the forward direction or the reverse direction is applied to the VCSEL and the optical output power changes by −2 dB, it is defined as damage or failure. FIG. 9 of the reference shows the result of the ESD damage test. According to the result, it is considered that ESD damage is a function of an oxidized aperture diameter or area and the ESD breakdown voltage increases as the oxidized aperture diameter increases.

However, the existent protective device for the VCSEL has the following problems. Since the protective device is disposed separately from the light emitting device in Japanese Published Unexamined Patent Application No. Hei 11-112026, in a case of handling the light emitting device as a single component, the ESD countermeasure is still insufficient. Further, this increases the number of elements constituting the laser device to increase the cost.

Integration of VCSEL and the protective diode on one chip in U.S. Pat. No. 6,185,240B1 may be a countermeasure for ESD during handling, but plural trenches have to be formed when the protective diode is formed on the substrate, which complicates the steps and cannot always form the diode easily.

While Bobby M. Hawkings, et al., "Reliability of Various Size Oxide Aperture VCSELs" Honeywell, 2000 shows that the ESD withstand voltage increases in proportion with the oxidized aperture diameter, desired basic laser characteristics cannot be obtained by merely increasing the oxidized aperture diameter. Particularly, in a single mode VCSEL, the oxidized aperture diameter tends to be decreased, which inevitably lowers the ESD withstand voltage.

SUMMARY OF THE INVENTION

The present invention addresses the problems in the prior art to improve the resistance to static voltage breakdown by integrating a vertical-cavity surface-emitting laser diode and a protective device and provide a semiconductor laser apparatus of high reliability and a manufacturing method thereof.

According to an embodiment of the present invention, a semiconductor laser apparatus includes: a substrate; a vertical-cavity surface-emitting semiconductor laser diode including a first mirror layer of a first conduction type, a second mirror layer of a second conduction type, an active region sandwiched between the first and the second mirror layers, a first electrode layer electrically connected with the first mirror layer and a second electrode layer electrically connected with the second mirror layer; and at least one Zener diode including a first semiconductor region of a first conduction type, a second semiconductor region of a second conduction type formed in a portion of the first semiconductor region and forming a PN junction with the first semiconductor region, a third electrode layer electrically connected with the first semiconductor region and a fourth electrode layer electrically connected with the second semiconductor region. The vertical-cavity surface-emitting semiconductor laser diode and the Zener diode are formed on the substrate, and the first electrode layer and the fourth electrode layer are electrically connected, and the second electrode layer and the third electrode layer are electrically connected.

BRIEF DESCRIPTION OF THE DRAWINGS

Embodiments of the present invention will be described in details based on the drawings, wherein:

FIGS. 2A and 2B show a semiconductor laser apparatus according to a first embodiment of the present invention in which FIG. 2A is a schematic plan view and FIG. 2B is a cross sectional view taken along the line X-X;

FIGS. 3A and 3B show a semiconductor laser apparatus according to a second embodiment of the present invention in which FIG. 3A is a schematic plan view and FIG. 3B is a cross sectional view taken along arrow X-X;

FIG. 4 is a cross sectional view of a semiconductor laser apparatus according to a third embodiment of the present invention;

FIG. 5 is a modification of a semiconductor laser apparatus according to the third embodiment;

FIGS. 9A and 8B are cross sectional views showing steps of manufacturing a semiconductor laser apparatus according to the second embodiment.

DETAILED DESCRIPTION OF THE INVENTION

The present invention is to be described by way of embodiments with reference to the drawings. In a semiconductor laser apparatus according to these embodiments of the present invention, a VCSEL and a Zener diode are located on upper parts of selectively oxidized type posts (or mesas) on a substrate.

Figure 1:
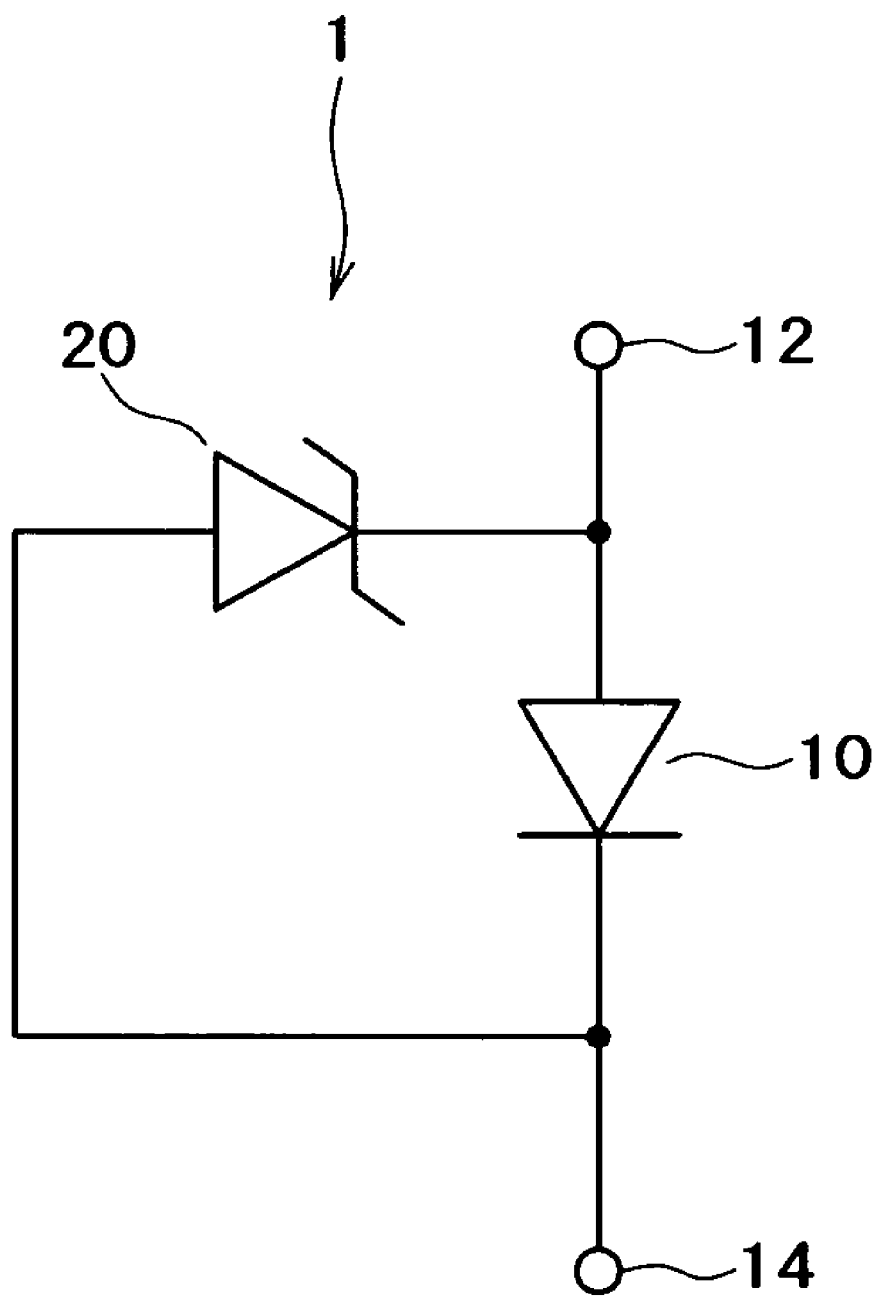
FIG. 1 is an equivalent circuit diagram of a semiconductor laser apparatus according to an embodiment of the present invention.

FIG. 1 is an equivalent circuit diagram of a semiconductor laser apparatus of this embodiment. A semiconductor laser apparatus 1 has a VCSEL 10 emitting a laser beam and a Zener diode 20 formed on the same substrate on which the VCSEL 10 is formed. The VCSEL 10 and Zener diode 20 are connected in parallel such that their polarities are opposite to each other. That is, the cathode (n-side) of the Zener diode is connected with the anode (p-side) of the VCSEL 10, while the anode (p-side) of the Zener diode 20 is connected with the cathode (n-side) of the VCSEL 10.

A p-side electrode terminal 12 is connected with the anode, while an n-side electrode terminal 14 is connected with the cathode of the VCSEL 10. When the VCSEL 10 is driven, about 2 V of forward voltage is applied between the electrode terminals 12 and 14 and a laser beam at a predetermined wavelength is emitted from the VCSEL 10. The Zener diode 20 flows a current from the electrode terminal 12 to the electrode terminal 14 when a Zener voltage (yield voltage) of 3 V or higher is applied.

On the other hand, when a reverse voltage is applied to the VCSEL 10, the Zener diode 20 operates in the forward voltage like a usual diode to supply a current from the electrode terminal 14 to the electrode terminal 12. Thus, the breakdown voltage of the VCSEL 10 can be increased substantially and the VCSEL 10 can be protected against high voltage of static electricity.

Figure 2A:
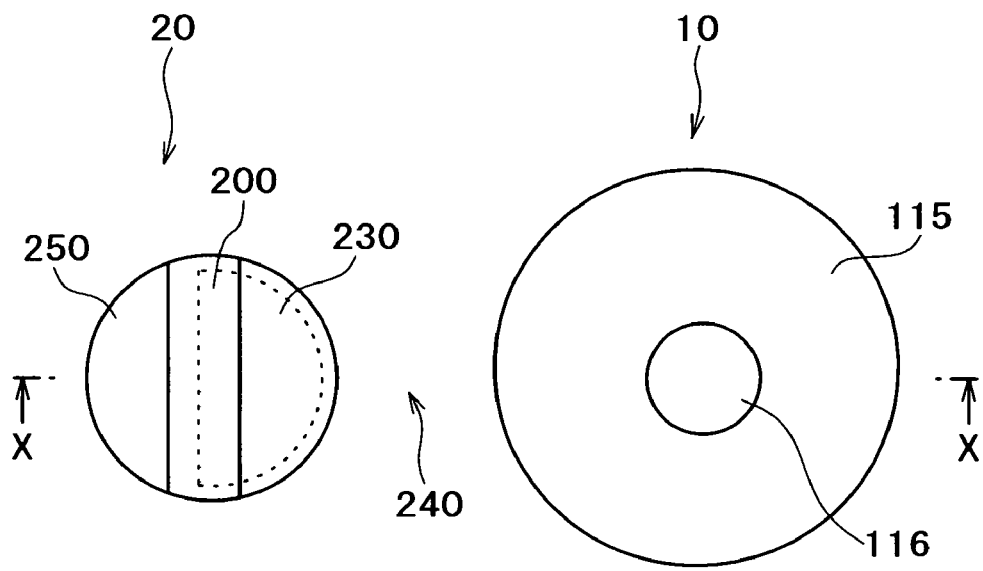
Figure 2B:
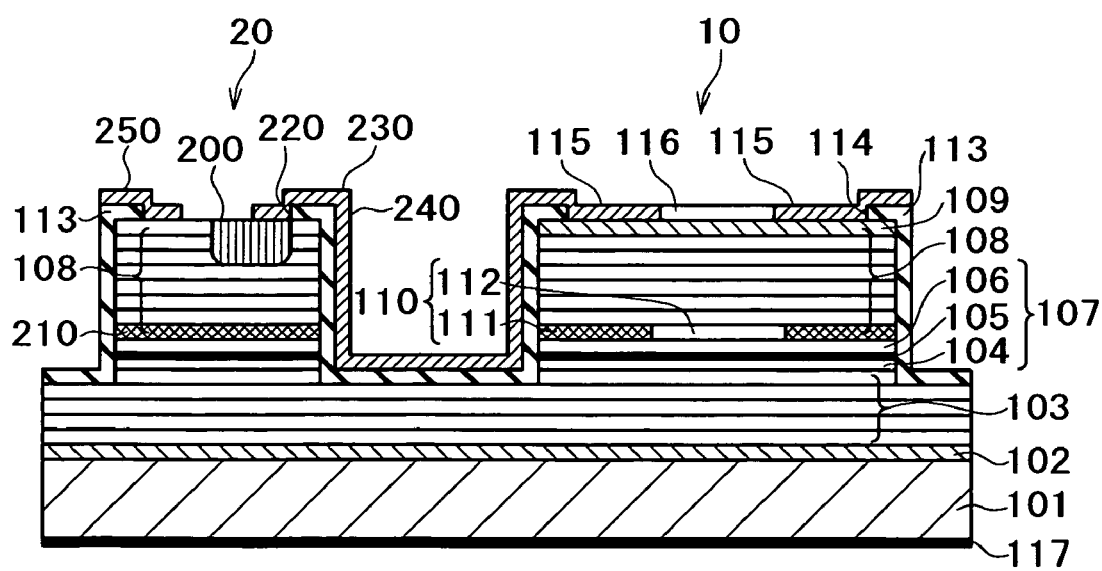

FIGS. 2A and 2B are views showing a configuration of a semiconductor laser apparatus according to a first embodiment. FIG. 2A is a schematic plan view of a semiconductor laser apparatus and FIG. 2B is a cross sectional view thereof taken along the line X-X. The VCSEL 10 and the Zener diode 20 are located on upper parts of cylindrical posts (or mesas) formed on a substrate 101. The posts are formed at the same time by anisotropically etching plural semiconductor layers epitaxially grown on the substrate to a predetermined depth. The first embodiment has a structure in which the post diameter of the VCSEL 10 is larger than that of the Zener diode 20.

The VCSEL 10 is formed by stacking, on the n-type GaAs substrate 101, an n-type buffer layer 102, an n-type lower DBR (Distributed Bragg Reflector) mirror layer 103, an active region 107 containing an undoped lower spacer layer 104, an undoped quantum well active layer 105, and an undoped upper spacer layer 106, and a p-type active DBR mirror layer 108 successively. A p-type contact layer 109 is formed on the uppermost layer of the upper DBR layer 108, and a p-type AlAs layer 110 is formed below the lowermost layer thereof. The AlAs layer 110 has an oxidized region 111 oxidized partially from the lateral side of the post and a circular conductive opening 112 surrounded by the oxidized region 111. The AlAs layer 110 conducts optical confinement and lateral current confinement by the oxidized region 111 and acts as a so-called current confining layer.

The lateral wall and the upper surface of the VCSEL 10 are covered with an interlayer insulation film 113. The interlayer insulation film 113 is provided with a contact hole 114 for exposing the surface of the contact layer 109. A p-side electrode layer 115 is formed on the interlayer insulation film 113, and the p-side electrode layer 115 is in ohmic contact with the contact layer 110 by way of the contact hole 114. A laser emitting window 116 is formed at the center of the p-side electrode layer 115 for emitting a laser beam. An n-side electrode layer 117 is formed at the back of the substrate 101.

The Zener diode 20 has an epitaxial layer of a composition identical with that of the VCSEL 10, but it is different in that a semiconductor region 200 formed as an n-conduction type is formed to a portion of the p-type upper DBR mirror layer 108 and in that an AlAs layer 110 as the lowermost layer of the upper DBR mirror layer 108 is entirely formed as an oxidized region 210. Oxidation of the AlAs layer 110 is conducted simultaneously to each of the posts and the oxidation speed for the AlAs layer 110 is equal for each of the posts. The post diameter for the Zener diode 20 is selected such that when the AlAs layer 110 of the VCSEL 10 is oxidized to leave a conductive opening 112 at a central portion, the AlAs layer 110 of the Zener diode 20 is entirely formed as the oxidized region 210.

An n-type semiconductor region 200 is formed by diffusing or implanting n-type impurities from the surface of the p-type upper DBR mirror layer 108. In this embodiment, a patterned silicon layer is vapor deposited on the surface of the upper DBR mirror layer 108 and applied with heat treatment at a high temperature to diffuse silicon from the upper DBR layer 108, thereby forming the semiconductor region 200 having a predetermined depth from the surface of the upper DBR layer 108. This forms a PN junction in the upper DBR mirror layer 108.

An inter-layer insulation film 113 is formed at the periphery of the post of the Zener diode 20 and a contact hole 220 is formed for exposing the surface of the upper DBR mirror layer 108 and the semiconductor region 200. An electrode layer 230 on the cathode of the Zener diode is electrically connected with the semiconductor region 200 by way of the contact hole 220. Further, the electrode 230 is connected with the p-side electrode layer 115 of the VCSEL 10 by way of a connection layer 240 extending on the lateral side and the bottom of the post. The p-side electrode 115, the electrode 230 and the connection layer 240 may be simultaneously formed integrally when patterning a metal wiring layer.

Further, an electrode layer 250 on the anode of the Zener diode 20 is electrically connected by way of the contact hole 220 to the upper DBR mirror layer 108 (p-type contact layer 109). Although not illustrated, the electrode layer 250 is electrically connected with the n-side electrode 117 at the back of the substrate 101.

The p-side electrode layer 115 is connected with the electrode terminal 12, and the n-side electrode layer 117 is connected with the electrode terminal 14 shown in FIG. 1. When a forward voltage is applied between the electrode terminals 12 and 14, if the voltage is lower than the Zener voltage of the Zener diode 20, the VCSEL 10 is driven to emit a laser beam from the emission window 116. The Zener voltage of the Zener diode 20 can be set to 3 V or higher. While the forward breakdown voltage of the VCSEL 10 is several hundreds of V, when a voltage higher than the Zener voltage is applied between the electrode terminals 12 and 14, a portion of the current is shunted by way of the Zener diode 20. In this case, since the Zener diode 20 is electrically insulated by the oxidized layer (AlAs layer) 210 from the n-type lower DBR mirror layer 103, leakage of the current flowing in the Zener diode to the substrate is suppressed.

Since, the forward voltage of the Zener diode 20 is about 0.7 V and the reverse breakdown voltage of the VCSEL 10 is several tens of V, when a reverse voltage is applied between the electrode terminals 12 and 14, the applied current is shunted by way of the Zener diode 20, and the VCSEL 10 is protected.

Figure 3A:
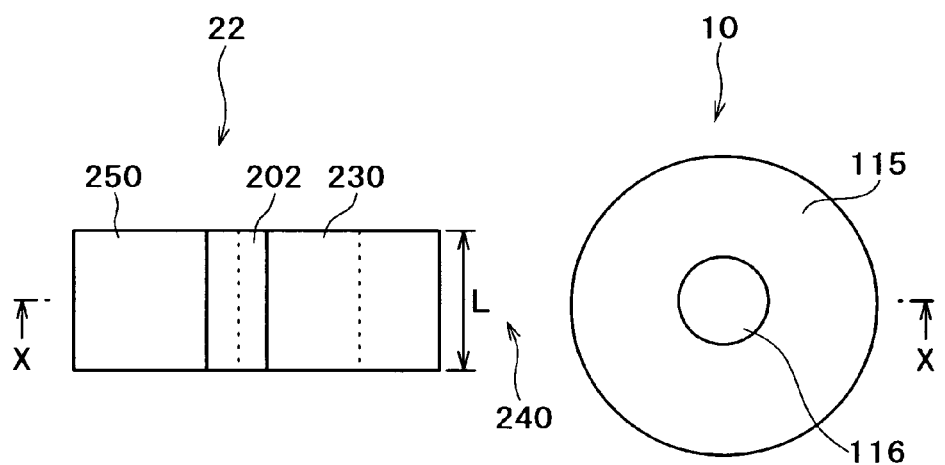
Figure 3B:
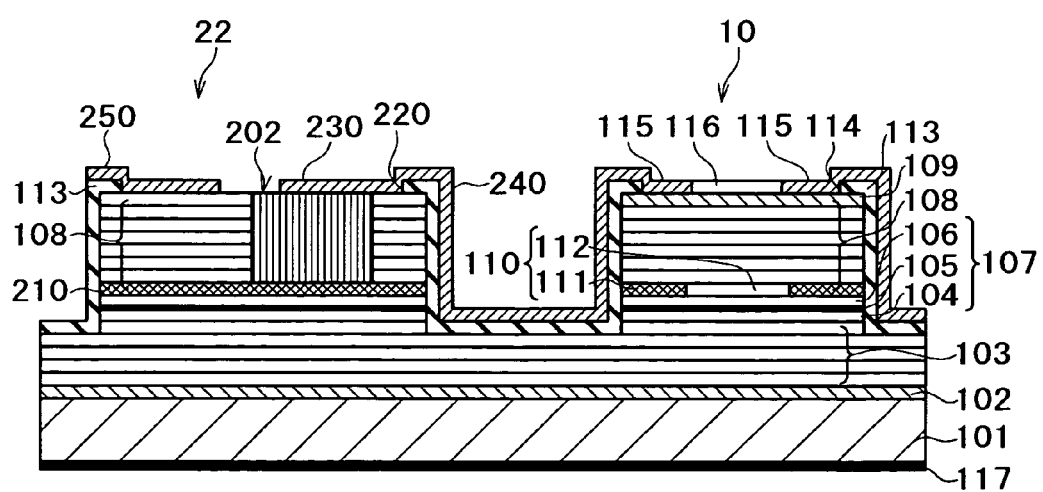

Then, FIGS. 3A and 3B show a semiconductor laser apparatus according to a second embodiment of the present invention. FIG. 3A is a schematic plan view of a semiconductor laser apparatus according to a second embodiment and FIG. 3B is a cross sectional view taken along the line X-X. In the second embodiment, unlike the first embodiment, a Zener diode 22 is located on an upper part of a rectangular post. The length L in the shorter side of the post is selected such that the entire AlAs layer 110 of the Zener diode 22 forms an oxidized region 210 when the AlAs layer 110 of the VCSEL 10 is oxidized to form an opening 112.

Further, an n-type semiconductor region 202 is formed by forming a mask layer such as a patterned resist on the surface of an upper DBR mirror layer 108 and ion-implanting H$^+$ therefrom. The depth of the semiconductor region 202 can be selected properly and it may be such a depth as reaching the oxidized region 210.

In the second embodiment, the Zener diode 22 is formed on an upper part of the rectangular post but other shapes than described above may be used. Further, the semiconductor region 202 can be formed also by diffusion (gas phase, liquid phase or solid phase) like in the first embodiment.

Then, FIG. 4 shows a semiconductor laser apparatus according to a third embodiment of the present invention. In the apparatus according to the third embodiment, a through hole 300 is formed adjacent to the post of a Zener diode 22. An electrode layer 250 of the Zener diode 22 extends from the lateral side of the post to the bottom and is electrically connected by way of a contact hole 310 formed in the interlayer insulation film 113 with a conductive material 320 filled in the through hole 300. The conductive material 320 is connected at the back of the substrate 101 with an n-side electrode layer 117, by which the anode electrode of the Zener diode 22 and the cathode electrode of the VCSEL 10 are joined.

FIG. 5 shows a modification of the third embodiment in which electrical contact is established with a portion of a lower DBR mirror layer 103 formed on the substrate instead of using the n-side electrode layer 117 at the back of the substrate 101. An electrode layer 250 of a Zener diode 22 is electrically connected by way of the contact hole 310 in an interlayer insulation film 113 to the n-type semiconductor layer of the lower DBR mirror 103. The anode electrode of the Zener diode 22 and the cathode electrode of the VCSEL 10 may be connected in this manner. Further, an n-type contact layer 330 may be present in the lower DBR mirror 103 and the contact layer 330 and the electrode layer 250 may be connected. In this case, a material may be selected for the contact layer 330 such that the reflectivity of the lower DBR mirror layer is not lowered.

Figure 6A:
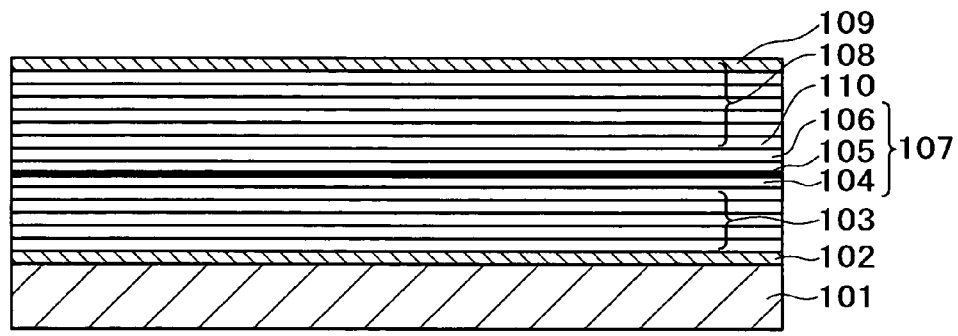
FIGS. 6A to 6C, 7A to 7C, 8A and 8B are cross sectional views showing processes of manufacturing a semiconductor laser apparatus according to the first embodiment.

Then, the steps of manufacturing a semiconductor laser apparatus according to the first embodiment is to be described with reference to FIGS. 6A to 6C, 7A to 7C, 8A and 8B. As shown in FIG. 6A, plural semiconductor layers are stacked on the substrate 101 by use of a metal organic chemical vapor deposition method (MOCVD). That is, on the n-type GaAs substrate 101, the n-type buffer layer 102, an n-type lower DBR mirror layer 103, active layer 107 containing the undoped lower spacer layer 104, undoped quantum well active layer 102 and undoped upper spacer layer 106, and p-type upper DBR mirror layer 108 containing the contact layer 109 and AlAs layer (current confining layer) 110 are stacked successively.

The lower DBR mirror layer 103 is a multi-layered stack including an n-type $Al_{0.9}Ga_{0.1}As$ layer and an n-type $Al_{0.3}Ga_{0.7}As$ layer with the thickness of each layer being $\lambda/4n_r$ (in which $\lambda$ represents an oscillation wavelength and $n_r$ is a refractive index of a medium) and the layers are stacked alternately at a period of 40.5. The carrier concentration after doping silicon as an n-type impurity is $3\times10^{18}$ cm$^{-3}$.

The lower spacer layer 104 in the active region 107 is an undoped $Al_{0.6}Ga_{0.4}As$ layer, and the quantum well active layer 105 contains an undoped $Al_{0.11}Ga_{0.89}As$ quantum well layer and an undoped $Al_{0.3}Ga_{0.7}As$ barrier layer. The upper spacer layer 106 is an undoped $Al_{0.6}Ga_{0.4}As$ layer.

The upper DBR mirror layer 108 is a multi-layered stack including a p-type $Al_{0.9}Ga_{0.1}As$ layer and a p-type $Al_{0.3}Ga_{0.7}As$ layer with the thickness of each layer being $\lambda/4n_r$ (where $\lambda$ represents an oscillation wavelength and $n_r$ is a refractive index of a medium) and the layers are stacked alternately at a period of 30. The carrier concentration after doping carbon as a p-type impurity is $3\times10^{18}$ cm$^{-3}$. The p-type contact layer 109 is a GaAs layer with a thickness of 20 nm and at a carbon concentration of $1\times10^{20}$ cm$^{-3}$.

Figure 6B:
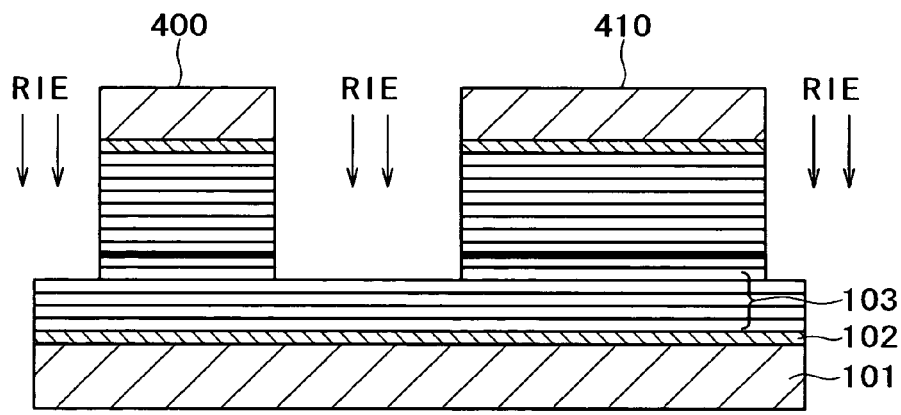

Then, as shown in FIG. 6B, mask patterns 400 and 410 are formed on the semiconductor layer by use of a photolithographic process. For the mask pattern, $SiO_2$ or resist can be used. The mask pattern 400 is a circular pattern corresponding to the outer profile of the Zener diode 20 while the mask pattern 410 is a circular pattern corresponding to the outer profile of the VCSEL 10.

Using the mask patterns 400 and 410, the stacked semiconductor layers are etched by reactive ion etching (RIE). Etching is conducted until a portion of the lower mirror layer 103 is exposed. Thus, a post or mesa for each of the Zener diode 20 and the VCSEL 10 is formed.

Figure 6C:
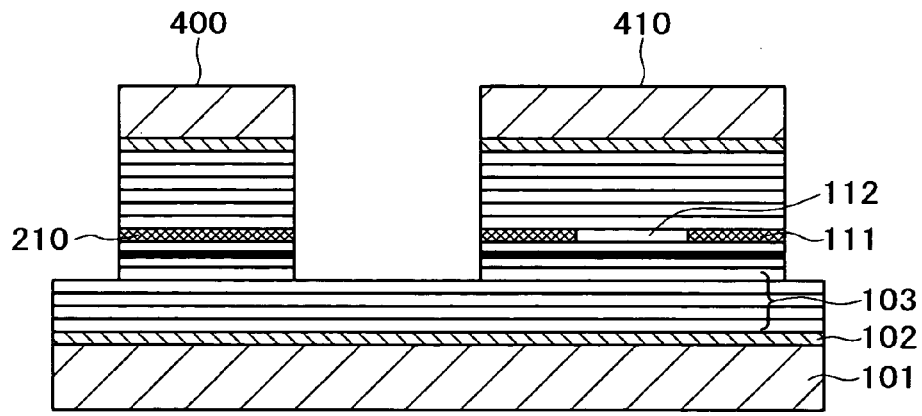

Then, as shown in FIG. 6C, the substrate 101 is exposed to a steam atmosphere at 350° C. using nitrogen as a carrier gas (flow rate: 2 liter/min) for 30 minutes. The oxidation rate of the AlAs layer 110 on the side of the VCSEL 10 is much higher compared with that of the $Al_{0.8}Ga_{0.2}As$ layer or the $Al_{0.1}Ga_{0.9}As$ layer constituting the upper mirror layer. Thus, oxidation is started for the AlAs layer 110 from the lateral side of the post and, finally, a current confining layer having the oxidized region 111 conforming the outer profile of the post and a conductive opening 112 surrounded with the oxidized region 111 are formed. The conductivity of the oxidized region 111 is lowered to form a current confining portion which also functions as an optical confining region since the optical refractive index is about one-half (to 1.6) compared with that of the peripheral semiconductor layer and the opening 112 forms a current injection portion.

On the other hand, since the post diameter of the Zener diode 20 is smaller than that of the VCSEL 10, the entire region of the AlAs layer 110 is oxidized from the lateral side to form an oxidized region 210.

Figure 7A:
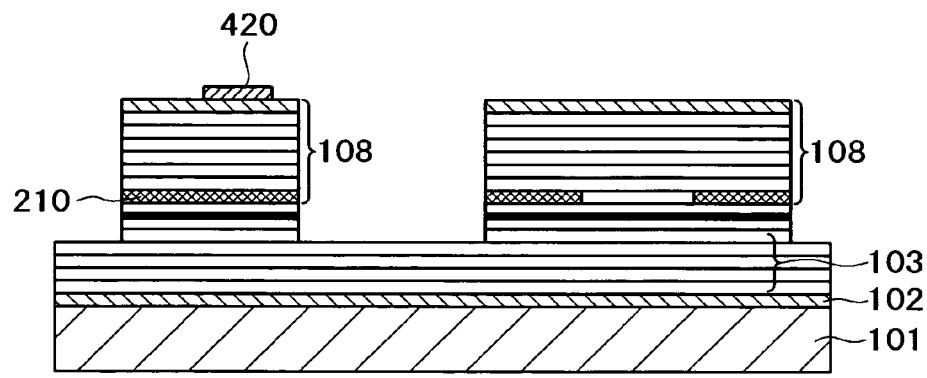
Figure 7B:
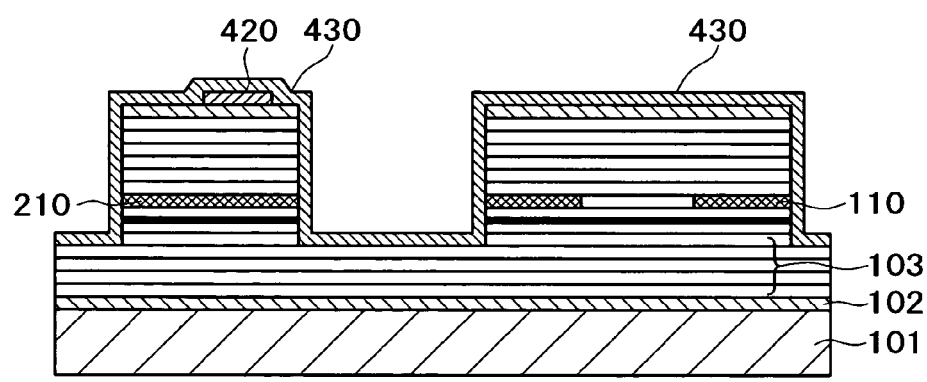
Figure 7C:
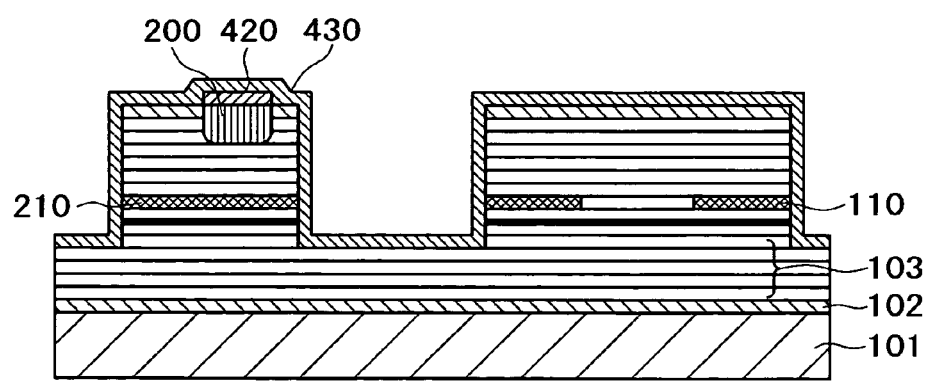

Then, as shown in FIG. 7A, a silicon layer 420 is vapor-deposited on the upper DBR mirror layer 108 of the Zener diode 20, which is patterned to a predetermined size. Then, as shown in FIG. 7B, a silicon nitride film 430 is vapor-deposited over the entire surface and applied with a heat treatment at a temperature of 850° C. for about two hours in an As atmosphere. Thus, silicon atoms are diffused from the silicon layer 420 into the p-type upper DBR layer 108 and, as shown in FIG. 7C, a semiconductor region 200 rendered to an n-conduction type is formed. The dopant concentration in the upper DBR layer 108 may be $2\times10^{18}$ to $10^{20}$/cm$^3$.

Figure 8A:
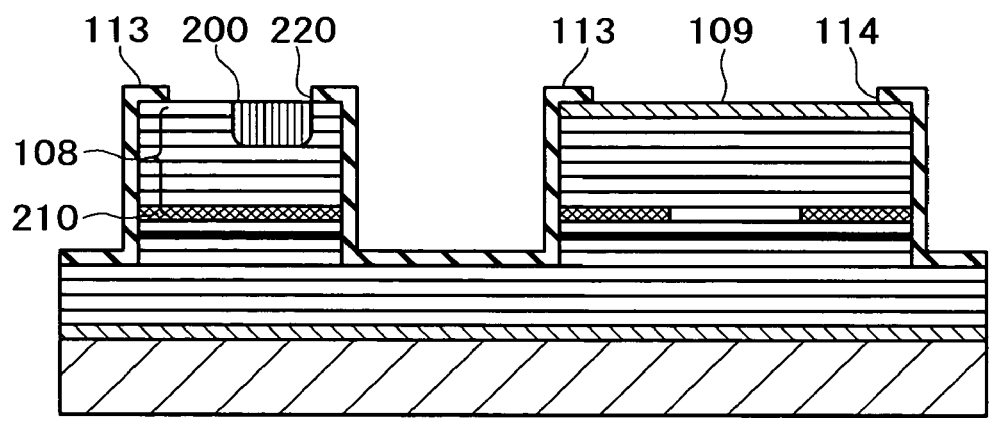
Figure 8B:
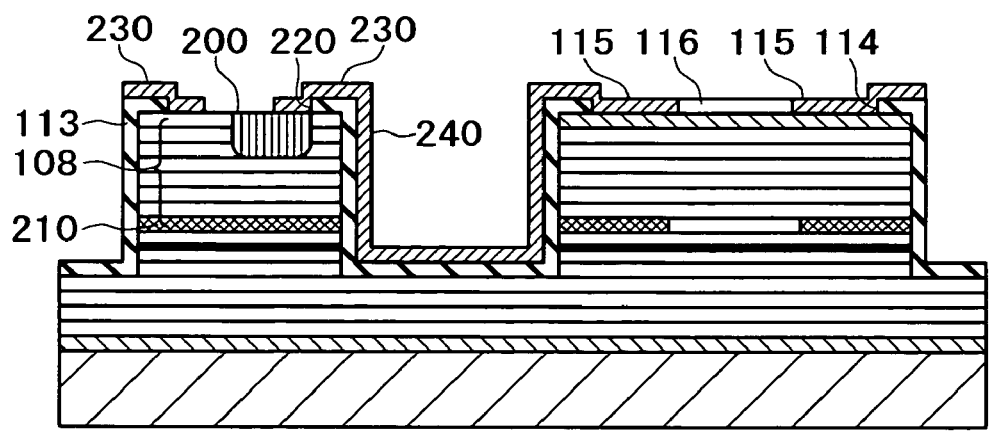

Then, the silicon layer 420 and the silicon nitride film 430 are removed and an interlayer insulation film 113 is deposited to the upper surface of the substrate including the exposed lateral side of the post. Then, as shown in FIG. 8A, a contact hole 114 is formed in the interlayer insulation film 113 at the top of the post of the VCSEL 10 to expose the contact layer 109. A contact hole 220 is formed in the interlayer insulation film 113 at the top of the post of the Zener diode 20, and the p-type contact layer 109 and the n-type semiconductor region 200 are exposed.

Successively, an electrode layer is formed over the entire surface of the substrate. The electrode layer is, for example, a stacked film of Ti/Au. The electrode layer is patterned by a photolithographic process, by which the p-side electrode layer 115, electrode layers 230, 250 and connection layer 240 are formed simultaneously. At the same time, the laser emitting window 116 is formed on the VCSEL 10. Then, the n-side electrode 117, such as of Ti/Au, is formed at the back of the substrate 101.

In the embodiment described above, the silicon atoms are diffused in the p-type upper DBR mirror layer 108 but impurities other than silicon can also be used. For example, carbon, selenium, etc. can be used. Further, diffusion may be gas phase or liquid phase diffusion.

Then, FIGS. 9 and 9B show a method for manufacturing a semiconductor laser apparatus according to a second embodiment. The processes up to the formation of a post and the formation of the oxidized regions 111, 210 are identical with those up to FIG. 6A to FIG. 6C in the first embodiment. Successively, a resist is applied over the entire surface of the substrate and, as shown in FIG. 9A, a resist 450 is patterned to form an opening at the top of the Zener diode 22. Then, $H^+$ ions are implanted at 320 Kev and by $5 \times 10^{14}/cm^3$ by use of the resist 450 as a mask. This forms the semiconductor region 202 rendered to the n-conduction type in the upper DBR layer 108. The depth of the semiconductor region 202 can be controlled by properly changing the implanting conditions.

After forming the n-type semiconductor region 202, the resist 450 is removed and the interlayer insulation film 113, and electrode layers 115, 230, 240 and 250 are formed in the same manner as in the first embodiment. Then, the n-side electrode layer 117 is formed at the back of the substrate 101.

As has been described above, according to the above embodiments, it is possible, by integrating the VCSEL 10 and the Zener diode 20 on the substrate, to increase the breakdown voltage of the VCSEL and prevent failure of the semiconductor laser apparatus by static electricity during handling of the apparatus or by a reverse bias voltage.

In the embodiments described above, a single Zener diode is formed on the substrate but plural Zener diodes may also be formed. Further, the post diameter and the post shape for the Zener diode or VCSEL can be changed properly as design matters. Further, while a GaAs compound semiconductor laser is shown for the VCSEL in the embodiments described above, it may be other semiconductor lasers using gallium nitride or gallium indium series.

The semiconductor laser apparatus according to the present invention can be utilized, for example, as a light source for optical communication equipment utilizing optical fibers, etc., optical communication system using them, as well as electronic apparatus and copying machines that conduct optical reading or writing.

As has been described above, according to an embodiment of the present invention, a semiconductor laser apparatus includes: a substrate; a vertical-cavity surface-emitting semiconductor laser diode (VCSEL) including a first mirror layer of a first conduction type, a second mirror layer of a second conduction type, an active region sandwiched between the first and the second mirror layers, a first electrode layer electrically connected with the first mirror layer and a second electrode layer electrically connected with the second mirror layer; and at least one Zener diode including a first semiconductor region of a first conduction type, a second semiconductor region of a second conduction type formed in a portion of the first semiconductor region and forming a PN junction with the first semiconductor region, a third electrode layer electrically connected with the first semiconductor region and a fourth electrode layer electrically connected with the second semiconductor region. The VCSEL and the Zener diode are formed on the substrate, and the first electrode layer and the fourth electrode layer are electrically connected, and the second electrode layer and the third electrode layer are electrically connected.

The Zener diode may contain an epitaxial layer of a composition identical to that of the first mirror layer, and the second-conduction-type semiconductor layer may be formed in a portion of the epitaxial layer.

For example, the second semiconductor region may be formed by diffusing impurities in a portion of the first semiconductor region. The impurities may contain elements of one of groups 2, 4 and 6 when the first semiconductor region is a semiconductor layer containing compounds of one of groups 3 to 5 (GaAs or AlGaAs layer). For example, the impurities may contain one carbon, silicon and selenium. Further, the second semiconductor region may be formed by gas phase diffusion, liquid phase diffusion or solid phase diffusion. The second semiconductor region may have an impurity concentration from $2 \times 10^{18}$ to $1 \times 10^{20}/cm^3$.

Further, the second semiconductor region may be formed by diffusing ion-implanted impurities in the first semiconductor region. For example, the impurities are $H^+$ ions when the first semiconductor region is a semiconductor layer containing compounds of one of groups 3 to 5.

The Zener diode may be insulated from the substrate by an insulation film and electrically insulated from the VCSEL. Thus, a leak current from the Zener diode may be suppressed. For example, the insulation film may be formed by oxidizing a portion of the epitaxial layer.

The VCSEL may contain a current confining layer formed by selective oxidation adjacent to the active region and the insulation film has a composition identical to that of the current confining layer. The current confining layer is formed by oxidizing the lateral side of a so-called post or a mesa structure. As the current confining layer, AlAs or AlGaAs is used.

A Zener voltage (breakdown voltage) of the Zener diode may be higher than a driving voltage of the VCSEL. The Zener voltage may be at least above 3 V and the driving voltage may be about 2 V.

The semiconductor laser apparatus also has a first and second posts formed on the substrate and having substantially equal height. The VCSEL and the Zener diode are located on upper parts of first and second posts, respectively, the first electrode layer in contact with the first mirror layer of the VCSEL is connected with a first metal wiring layer extended on a lateral side of the first post, and the first metal wiring layer is further extended on a lateral side of the second post and connected with the fourth electrode layer in contact with the second semiconductor region of the Zener diode.

The second electrode layer of the VCSEL may be formed to a back of the substrate, the second electrode layer may be connected with a second metal wiring layer extended by way of a through hole formed in the substrate, and the second metal wiring layer may be connected with the third electrode layer in contact with the first semiconductor region.

Further, the method of manufacturing the semiconductor laser apparatus according to another embodiment of the present invention may include the steps of: stacking plural semiconductor layers on a substrate, the semiconductor layers including at least a first mirror layer of a first conduction type, a second mirror layer of a second conduction type and an active region sandwiched by the first and the second mirror layers; etching the plural semiconductor layers over the substrate to form at least first and second posts; oxidizing compound semiconductor layers contained in the first and the second posts thereby forming a conductive region surrounded by an oxidized region of the compound semiconductor layers of the first post and oxidizing the entire compound semiconductor layers of the second post; forming a semiconductor region of a second conduction type in the first mirror layer of the second post; and electrically connecting the semiconductor region of the second post with the first mirror layer of the first post.

Since the VCSEL and the Zener diode (protective device) are integrated and, further, the Zener diode is constituted by forming a second semiconductor region which is rendered to a second-conduction-type to a portion of the first semiconductor region, the Zener diode integrated on the same substrate as the VCSEL can be formed by a process simpler than the conventional trench process for forming the diode. At the same time, since the breakdown voltage of the VCSEL can be increased, failure of the VCSEL upon handling such as mounting can be avoided. Further, since separate mounting of the protective device is not required as in the conventional cases, the mounting process can be simplified.

The present invention has been described above specifically with reference to the embodiments but the present invention is not restricted to such specified embodiments and can be changed and modified variously within the scope of the gist of the present invention described in the scope for the claim of patent.

The entire disclosure of Japanese Patent Application No. 2004-126269 filed on Apr. 22, 2004 including specification, claims, drawings and abstract is incorporated herein by reference in its entirety.

What is claimed is:

1. A semiconductor laser apparatus comprising:
   a substrate;
   a vertical-cavity surface-emitting semiconductor laser diode including a first mirror layer of a first conduction type, a second mirror layer of a second conduction type, an active region sandwiched between the first and the second mirror layers, a first electrode layer electrically connected with the first mirror layer and a second electrode layer electrically connected with the second mirror layer;
   at least one Zener diode including a first semiconductor region of a first conduction type, a second semiconductor region of a second conduction type formed in a portion of the first semiconductor region and forming a PN junction with the first semiconductor region, a third electrode layer electrically connected with the first semiconductor region and a fourth electrode layer electrically connected with the second semiconductor region, wherein
   the Zener diode is entirely insulated from the substrate by an insulation film disposed between the Zener diode and the substrate,
   the vertical-cavity surface-emitting semiconductor laser diode and the Zener diode are formed on the substrate, and
   the first electrode layer and the fourth electrode layer are electrically connected, and the second electrode layer and the third electrode layer are electrically connected.

2. The semiconductor laser apparatus according to claim 1, wherein the Zener diode has an epitaxial layer of a composition identical to that of the first mirror layer and the second semiconductor region is formed in a portion of the epitaxial layer.

3. The semiconductor laser apparatus according to claim 1, wherein the second semiconductor region is formed by diffusing impurities in a portion of the first semiconductor region.

4. The semiconductor laser apparatus according to claim 3, wherein the impurities contain elements of one of groups 2, 4 and 6 when the first semiconductor region is a semiconductor layer containing compounds of one of groups 3 to 5.

5. The semiconductor laser apparatus according to claim 3, wherein the impurities contain one of carbon, silicon and selenium.

6. The semiconductor laser apparatus according to claim 3, wherein the second semiconductor region is formed by one of gas phase diffusion, liquid phase diffusion and solid phase diffusion.

7. The semiconductor laser apparatus according to claim 3, wherein the second semiconductor region has an impurity concentration from $2 \times 10^{18}$ to $1 \times 10^{20}/cm^3$.

8. The semiconductor laser apparatus according to claim 1, wherein the second semiconductor region is formed by diffusing ion-implanted impurities in the first semiconductor region.

9. The semiconductor laser apparatus according to claim 8, wherein the impurities are $H^+$ ions when the first semiconductor is a semiconductor layer containing compounds of one of groups 3 to 5.

10. The semiconductor laser apparatus according to claim 1, wherein the insulation film is formed by oxidizing a portion of the epitaxial layer.

11. The semiconductor laser apparatus according to claim 1, wherein
    the vertical-cavity surface-emitting semiconductor layer diode comprises a current confining layer adjacent to the active region,
    the current confining layer being formed by selectively oxidizing a portion of one of the first and second mirror layers, and
    the insulation film has a composition identical to that of the current confining layer.

12. The semiconductor laser apparatus according to claim 1, wherein a Zener voltage of the Zener diode is higher than a driving voltage of the vertical-cavity surface-emitting semiconductor laser diode.

13. The semiconductor laser apparatus according to claim 12, wherein the Zener voltage is at least about 3 V.

14. The semiconductor laser apparatus according to claim 1, further comprising:
    a first and second posts formed on the substrate and having substantially equal height, wherein
    the vertical-cavity surface-emitting semiconductor laser diode and the Zener diode are located on upper parts of first and second posts, respectively,
    the first electrode layer in contact with the first mirror layer of the vertical-cavity surface-emitting semiconductor laser diode is connected with a first metal wiring layer extended on a lateral side of the first post, and
    the first metal wiring layer is further extended on a lateral side of the second post and connected with the fourth electrode layer in contact with the second semiconductor region of the Zener diode.

15. The semiconductor laser apparatus according to claim 14, wherein the second electrode layer of the vertical-cavity surface-emitting semiconductor laser diode is formed at a back of the substrate,
the second electrode layer is connected with a second metal wiring layer by way of a through hole formed in the substrate, and
the second metal wiring layer is connected with the third electrode layer in contact with the first semiconductor region.

* * * * *